(12) United States Patent
Leoncini et al.

(10) Patent No.: US 11,515,154 B2
(45) Date of Patent: Nov. 29, 2022

(54) SELECTIVE DEPOSITION OF A PASSIVATION FILM

(71) Applicants: Applied Materials, Inc., Santa Clara, CA (US); National University of Singapore, Singapore (SG)

(72) Inventors: Andrea Leoncini, Singapore (SG); Yong Wang, Singapore (SG); Doreen Wei Ying Yong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 17/081,506

(22) Filed: Oct. 27, 2020

(65) Prior Publication Data
US 2022/0130660 A1 Apr. 28, 2022

(51) Int. Cl.
 *C23C 16/04* (2006.01)
 *H01L 21/02* (2006.01)
 *H01L 21/67* (2006.01)

(52) U.S. Cl.
CPC ...... *H01L 21/0228* (2013.01); *H01L 21/0212* (2013.01); *H01L 21/02107* (2013.01); *H01L 21/02697* (2013.01); *H01L 21/67023* (2013.01); *B81C 2201/0198* (2013.01)

(58) Field of Classification Search
CPC .......................... C23C 16/04; C23C 16/45525
See application file for complete search history.

(56) References Cited

U.S. PATENT DOCUMENTS

| | | | |
|---|---|---|---|
| 7,326,444 B1 | 2/2008 | Wu et al. | |
| 9,803,277 B1 * | 10/2017 | Longrie | H01L 21/76883 |
| 9,805,974 B1 * | 10/2017 | Chen | C23C 16/08 |
| 9,895,715 B2 * | 2/2018 | Haukka | C23C 16/403 |
| 10,358,719 B2 * | 7/2019 | Yu | C23C 16/45544 |
| 2004/0087141 A1 * | 5/2004 | Ramanathan | C23C 18/44 |
| | | | 257/E21.585 |
| 2006/0172529 A1 * | 8/2006 | Shih | H01L 21/76849 |
| | | | 257/E21.174 |
| 2015/0170961 A1 * | 6/2015 | Romero | H01L 21/76801 |
| | | | 438/641 |
| 2017/0358482 A1 * | 12/2017 | Chen | H01L 21/28562 |
| 2018/0142348 A1 * | 5/2018 | Yu | C23C 16/403 |

(Continued)

FOREIGN PATENT DOCUMENTS

| | | | |
|---|---|---|---|
| CN | 110226224 A | 9/2019 | |
| KR | 10-2019-0026805 | * 3/2019 | C07D 487/10 |

(Continued)

OTHER PUBLICATIONS

Farm, Elina, et al., "Selective-Area Atomic Layer Deposition Using Poly(vinyl pyrrolidone) as a Passivation Layer". Journal of The Electrochemical Society, 157 (1) K10-K14 (2010).*

(Continued)

*Primary Examiner* — Bret P Chen
(74) *Attorney, Agent, or Firm* — Servilla Whitney LLC (57) ABSTRACT

Selective deposition methods are described. An exemplary method comprises exposing the substrate comprising a first surface and a second surface to an anchor reactant and selectively depositing the anchor reactant on the first surface as a seed layer, wherein the anchor reactant comprises an ethynyl derivative with a headgroup that selectively targets the first surface.

20 Claims, 3 Drawing Sheets

(56) References Cited

U.S. PATENT DOCUMENTS

| | | | |
|---|---|---|---|
| 2018/0151345 A1* | 5/2018 | Haukka | C23C 16/403 |
| 2018/0218914 A1* | 8/2018 | Basu | H01L 21/321 |
| 2018/0233350 A1* | 8/2018 | Tois | H01L 21/0272 |
| 2019/0017170 A1* | 1/2019 | Sharma | H01L 21/0228 |
| 2019/0164748 A1* | 5/2019 | Chou | H01L 21/76802 |
| 2019/0316256 A1 | 10/2019 | Bhuyan et al. | |
| 2019/0341245 A1* | 11/2019 | Tois | H01L 21/02164 |
| 2020/0066539 A1 | 2/2020 | Pearlstein | |
| 2020/0071816 A1* | 3/2020 | Lei | C23C 16/0236 |

FOREIGN PATENT DOCUMENTS

| | | |
|---|---|---|
| WO | 2019036188 A1 | 2/2019 |
| WO | 2019204121 A1 | 10/2019 |

OTHER PUBLICATIONS

Soethoudt, Job, et al., "Impact of SiO2 surface composition on trimethylsilane passivation for area-selective deposition". Journal of Materials Chemistry C, 2019, 7, 11911-11018.*

Wu, Lauryn, et al., "New families of large band gap 2D topological insulators in ethynyl-derivative functionalized compounds". Applied Surface Science 484 (2019) 1208-1213.*

Martynow, Jacek, et al., "Preparation of Ethynylbenzene Derivatives from Substituted Benzaldehydes". Organic Process Research & Development 2019, 1026-1033.*

Geiger, William E., et al., "Anodic Oxidation of Ethynylferrocene Derivatives in Homogeneous Solution and Following Anodic Deposition onto Glassy Carbon Electrodes". ChemElectrochem, 6 (23) 2019 pp. 5880-5887.*

Wang, Changsheng, et al., "Molecular Wires Comprising π-Extended Ethynyl- and Butadiynyl-2,5-Diphenyl-1,3,4-Oxadiazole Derivatives: Synthesis, Redox, Structural, and Optoelectronic Properties". J. Am. Chem. Soc. 2006, 128, 3789-3799.*

Wood, Edgar R., et al., "6-Ethynylthieno[3,2-d]- and 6-ethynylthieno[2,3-d]pyrimidin-4-anilines as tunable covalent modifiers of ErbB kinases". PNAS, vol. 15, No. 8, Feb. 26, 2008, 2773-2778.*

Van de Loo, Bas W.H., et al., "Atomic-Layer Deposited Passivation Schemes for c-Si Solar Cells". 2016 IEEE 43rd Photovoltaic Specialists Conference (PVSC), 2016, pp. 3655-3660.*

Zheng, Li, et al., "Area-Selective Atomic Layer Deposition of TiN Using Trimethoxy(octadecyl)silane as a Passivation Layer". Langmuir, 2020, 36, 13144-13154.*

PCT International Search Report and Written Opinion in PCT/US2021/056628 dated Feb. 17, 2022, 10 pages.

U.S. Appl. No. 17/081,494, filed Oct. 27, 2020. "Selective Deposition Of A Heterocyclic Passivation Film On A Metal Surface".

U.S. Appl. No. 17/081,498, filed Oct. 27, 2020. "Area-Selective Atomic Layer Deposition Of Passivation Layers".

U.S. Appl. No. 17/081,482, filed Oct. 27, 2020. "Selective Deposition Of A Passivation Film On A Metal Surface".

Adamkiewicz, Maigorzata, "Self-Assembled Monolayers on Silicon: Deposition and Surface Chemistry", http://hdl.handle.net/10023/3938.

Bobb-Semple, Dara, et al., "Area-Selective Atomic Layer Deposition Assisted by Self-Assembled Monolayers: A Comparison of Cu, Co, W, and Ru", Chem. Mater. 2019, 31, 1635-1645, Feb. 5, 2019.

Durainatarajan, P., et al., "Self-assembly on copper surface by using imidazole derivative for corrosion protection". Journal of Adhesion Science and Technology, 2018, vol. 32, No. 16, 1733-1749, Feb. 19, 2018.

Khuong, Kelli S., et al., "The Mechanism of the Self-Initiated Thermal Polymerization of Styrene. Theoretical Solution of a Classic Problem", J. Am. Chem. Soc. 2005, 127, 1265-1277.

Liang, Liyuan, et al., "The copper(I)-catalyzed alkyne-azide cycloaddition (CuAAC) "click" reaction and its applications. An overview". Coordination Chemistry Reviews 255 (2011) 2933-2945.

Pattison, Thomas G., et al., "Surface Initiated Polymer Thin Films for the Area Selective Deposition and Etching of Mietal Oxides", ACS Nano, https://dx.doi.org/10.1021/acsnano.9b09637, Mar. 13, 2020.

Rao, B V Appa, et al., "Self-assembled 1-octadecyl-1H-benzimidazole film on copper surface for corrosion protection", J. Chem. Sci. vol. 125, No. 6, Nov. 2013, pp. 1325-1338, Aug. 21, 2013.

Winther-Jensen, Bjorn, et al., "Vapor Phase Polymerization of Pyrrole and Thiophene Using Iron(III) Sulfonates as Oxidizing Agents", Macromolecules 2004, 37, 5930-5935, Jul. 10, 2004.

Ziarani, Ghodsi Mohammadi, et al., "Advances in click chemistry for silica-based material construction", RSC Adv . . . 2016, 6, 21979.

* cited by examiner

SELECTIVE DEPOSITION OF A PASSIVATION FILM

FIELD

Embodiments of the disclosure relate methods for selectively depositing a passivation film. In particular, embodiments of the disclosure are directed to methods of depositing passivation films selectively on metal surfaces or dielectric surfaces.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Area-elective atomic layer deposition (AS-ALD) can be used for selective deposition of material. During AS-ALD, when the deposited ALD film becomes thicker than the self-assembled monolayers (SAM) used to passivate non-growth surfaces, the ALD film may grow sideways (which may be referred to as mushrooming), thus reducing selectivity. It is not feasible to form directly thicker protective SAMs because the precursors are not deliverable in vapor phase. There is an ongoing need in the art for methods to improve deposition selectivity and to avoid problems during AS-ALD.

SUMMARY

An embodiment of the disclosure pertains to a method of selectively depositing a passivation film on a substrate comprising: exposing the substrate comprising a first surface and a second surface to an anchor reactant; and selectively depositing the anchor reactant on the first surface as a seed layer, wherein the anchor reactant comprises an ethynyl derivative with a headgroup that selectively targets the first surface.

Another embodiment pertains to a method of depositing an ALD film with high aspect ratio comprising (a) exposing a substrate comprising a first surface and a second surface to an anchoring reactant, wherein the anchoring reactant is a 4-ethylnylbenzene derivative with a headgroup that selectively targets the first surface and forms a seed layer; (b) forming a passivation film, wherein the seed layer is exposed to a first monomer to form the passivation film having a thickness; (c) growing the thickness of passivation film, wherein the passivation film is reacted to a second monomer; (d) performing an atomic layer deposition to deposit the ALD film having a thickness, wherein the thickness of ALD film remains equal or less than the thickness of passivation film; (e) repeating the steps (b), (c) and (d) sequentially at least once, wherein the passivation film increases to a thickness in a range of from 1 nm to 50 nm with each repetition of (b) and (c); and (f) removing the passivation film by exposing to $O_2$ or $O_2$ plasma.

Another aspect pertains to a non-transitory computer readable medium including instructions, that, when executed by a controller of a substrate processing chamber, causes the substrate processing chamber to expose a substrate to an anchor reactant, a first monomer, a second monomer to form a passivation layer having a thickness and an ALD reactant in a predetermined order such that a resulting ALD film has a thickness that remains less than or equal to the thickness of the passivation layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to a process comprising the sequential exposure of two or more reactive compounds to deposit a layer of material on a substrate.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

A "metal" as used herein refers to metal, metal alloy, metal oxide, metal nitride, or combination thereof for example, comprising copper, cobalt, nickel, tungsten, ruthenium, chromium, iron, platinum, gold, silver, molybdenum, gallium, indium indium tin oxide, fluorine doped tin oxide and Al-doped zinc oxide. In one or more embodiments, metal oxide does not include dielectric oxides.

A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus for example, where a film/layer or partial film/layer has been deposited onto the metal surface, the exposed surface of the newly deposited film/layer becomes the metal surface.

A "dielectric surface", as used herein, refers to any portion of a substrate or portion of a material surface formed with the dielectric material. Non-limiting examples of dielectric materials include $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$ and $KNbO_3$. The dielectric surface may be exposed to a pretreatment process to polish, coat, dope, etch, reduce, oxidize, hydroxylate, anneal, UV cure, e-beam cure and/or bake the substrate. In addition to the pretreatment directly on the dielectric surface itself, in the present disclosure, any of the dielectric surface treatment disclosed may also be performed on an underlayer metal surface as disclosed in more detail below, and the term "dielectric surface" is intended to include such underlayer as the context indicates. Thus for example, where a film/layer or partial film/layer has been deposited onto the dielectric surface, the exposed surface of the newly deposited film/layer becomes the dielectric surface.

As used in this specification and the appended claims, the phrase "selectively over", or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

Embodiments of the disclosure advantageously provide methods for pretreating the substrate. The substrate comprises a first surface and a second surface. The pretreatment selectively blocks the first surface and allows subsequent deposition of metal or dielectric material on the second surface.

Embodiments provide methods that allow the growth of thicker AS-ALD films while avoiding mushrooming effect by concurrently growing the protective film. In one or more embodiments, molecular precursors are selected to form rigid straight structures and to minimize reactivity of the polymer during the ALD process. This allows adjustment of the height of the polymer layer during the ALD process, limit the mushrooming effect, and thus enable deposition of high aspect ratio (AR) features. In some embodiments, the protective film is grown in situ, made of rigid chains to prevent folding, the precursors are small molecules, and its thickness can be progressively increased during the ASD process. According to one or more embodiments, mushrooming of ALD films is avoided. In some embodiments, the method allows for growth of high aspect ratio films. In some embodiments, use of small molecular precursors that are easier to deliver provide tunable thickness of film.

Embodiments take advantage of the reverse electron demand Diels-Alder reaction between tetrazine and alkynes. The 1,4-diethynylbenzene and 1,2,4,5-tetrazine act as bifunctional reagents and can react sequentially to form a polyphenylene polymer. In embodiments, there is deposition of a seed SAM layer in the non-growth area. The seed layer is composed of a 4-ethylnylbenzene derivative, bearing an anchoring group. The anchoring group can be designed to be selective towards the non-growth area. After formation of the seed SAM, sequentially pulsing the two reagents in an ALD tool results in the ring-by-ring growth of the polymer. The resulting polyphenylene polymer should be inert towards most ALD processes. The two monomers can interact with metallic surfaces, but given their low molecular weight, desorption should be favored during the purge step of the cycle. The growth of the polymer layer can be alternated with the growth of the ALD film, forming a supercycle.

In embodiments, initially, a thin polymer film is deposited, followed by the desired ALD film. When the thickness of the two films is comparable, more polymer can be grown, and the sequence repeated. Maintaining the polymer passivation film thicker than the other ALD film limits the sideways growth of ALD film (mushrooming effect). Growing the two films concurrently and progressively reduces chances for the polymer chains to fold and collapse at the edges.

For blocking, the substrate is pretreated with an anchor reactant. The anchor reactant selectively reacts and binds to the metal surface or the dielectric surface forming a seed layer. In some embodiments, the anchor reactant comprises ethynyl derivative with a headgroup that selectively targets the first surface. In some embodiments, the ethynyl derivative includes a 4-ethynylbenzene derivative.

In some embodiments, non-limiting examples of the anchor reactant has a structure according to Formula (I), Formula (II), Formula (III) or Formula (IV):

In some embodiments, wherein the first surface comprises metal surfaces, the headgroup includes a —COOH group, a —COOR group, a —CONNR$_2$ group, a —PO(OH)$_2$ group, a —PO(OR)$_2$ group, a —NH$_2$ group, a —NR$_2$ group, an acetylacetone group, a pyrrole group, a pyridine group and a thiophene group, and wherein R is an alkyl or a phenyl derivative. In some embodiments, the metal surface comprises metal, metal alloy, metal oxide, metal nitride, or combination thereof. Non-limiting examples of metal may be copper, cobalt, nickel, tungsten, ruthenium, chromium, iron, platinum, gold, silver, molybdenum, gallium, indium or combination thereof. In some embodiments, wherein the first surface comprises the metal surface, the second surface comprises the dielectric surface.

In some embodiments, wherein the first surface comprises dielectric surfaces, the headgroup may be from the group consisting of a —SiCl$_3$ group, a —Si(OR)$_3$ group and a —Si(NR$_2$)$_3$ group, wherein R is an alkyl or a phenyl derivative. Non-limiting examples of dielectric surface may be SiO$_x$, Si$_x$N$_y$, Si, SiON, AlO$_x$, Al$_2$O$_3$, HfO$_x$, ZrO$_2$, TiO$_x$, TiN, Ta$_x$O$_5$, Ta$_2$O$_5$, Y$_2$O$_3$, La$_2$O$_3$, AN, MgO, CaF$_2$, LiF, SrO, SiC, BaO, HfSiO$_4$, LaAlO$_3$, Nb$_2$O$_5$, BaTiO$_3$, SrTiO$_3$, Bi$_4$Ti$_3$O$_{12}$, Pb(Zr, Ti)O$_3$, CaCu$_3$Ti$_4$O$_{12}$, LiNbO$_3$, BaTiO$_3$, LiNbO$_3$ and KNbO$_3$ or combination thereof. In some embodiments, wherein the first surface comprises the dielectric surface, the first surface comprises the metal surface.

In some embodiments, after depositing the seed layer, a chemical vapor deposition process is performed to deposit a CVD film. In other embodiments, after depositing the seed layer, an atomic layer deposition process is performed to deposit an ALD film. In some embodiments, the thickness of ALD film is equal to or less than the thickness of seed layer. In some embodiments, wherein the seed layer is deposited on the metal surface, the ALD film comprises the dielectric material. Non-limiting examples of the dielectric material includes SiO$_x$, Si$_x$N$_y$, Si, SiON, AlO$_x$, Al$_2$O$_3$, HfO$_x$, ZrO$_2$, TiO$_x$, TiN, Ta$_x$O$_5$, Ta$_2$O$_5$, Y$_2$O$_3$, La$_2$O$_3$, AN, MgO, CaF$_2$, LiF, SrO, SiC, BaO, HfSiO$_4$, LaAlO$_3$, Nb$_2$O$_5$, BaTiO$_3$, SrTiO$_3$, Bi$_4$Ti$_3$O$_{12}$, Pb(Zr, Ti)O$_3$, CaCu$_3$Ti$_4$O$_{12}$, LiNbO$_3$, BaTiO$_3$, LiNbO$_3$, KNbO$_3$ or combination thereof. In some embodiments, wherein the seed layer is deposited on the dielectric surface, the ALD film comprises metal, metal alloy, metal oxide, metal nitride, or combination thereof. Non-limiting examples of the metal may be copper, cobalt, nickel, tungsten, ruthenium, chromium, iron, platinum, gold, silver, molybdenum, gallium, indium or combination thereof. In some embodiments, after depositing the ALD film, the passivation film is removed. In some embodiments, the passivation film is removed by exposing the substrate to O$_2$ or O$_2$ plasma.

In some embodiments, the substrate with the seed layer is cleaned prior to performing the atomic layer deposition. In some embodiments, only the first surface with the seed layer is cleaned prior to performing the atomic layer deposition. In some embodiments, wherein the first surface is the metal surface, the substrate or the first surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of H$_2$.

In some embodiments, the seed layer remains bound to the first surface at a higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C., or 50° C. to 500° C.

In some embodiments, the seed layer is removed from the substrate after performing the atomic layer deposition of the dielectric film. The seed layer may be removed by any suitable selective etching process. Suitable selective etching processes include, but are not limited to, the use of oxygen, oxygen plasmas and fluorine plasmas. In some embodiments, when oxygen or oxygen plasma is used to remove the seed layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the seed layer is removed by sequential exposure of the substrate to an oxygen plasma and a hydrogen plasma.

In some embodiments, the seed layer further reacts with a first monomer to form a passivation film. In some embodiments, the first monomer comprises tetrazine derivative. Non-limiting examples of the tetrazine derivative includes 1,2,4,5-tetrazine; 3,6-dimethyl-1,2,4,5-tetrazine; 3,6-diethyl-1,2,4,5-tetrazine; 3,6-dipropyl-1,2,4,5-tetrazine; 3,6-diisopropyl-1,2,4,5-tetrazine; or combination thereof.

Figure 2:
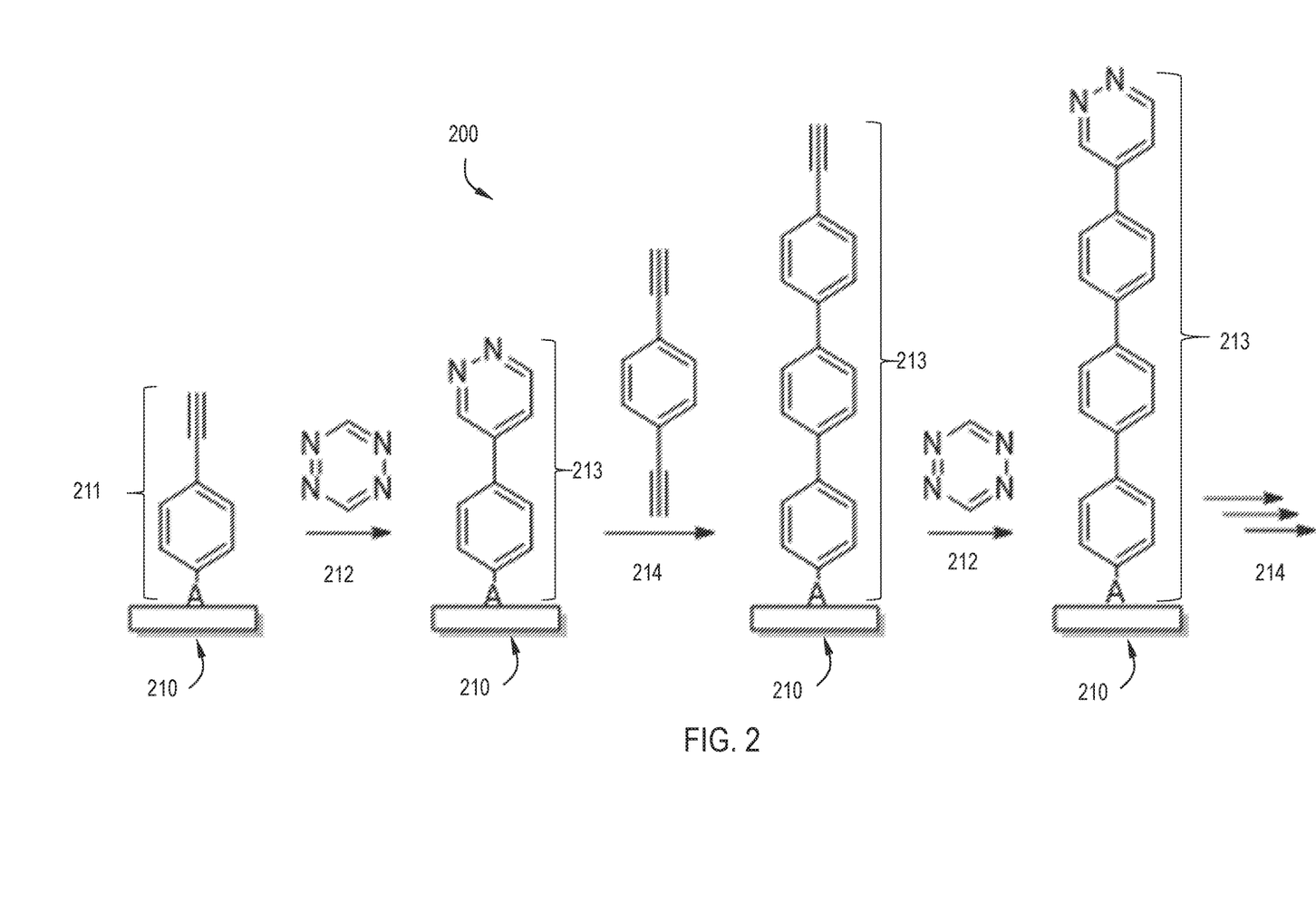
FIG. 2 shows a reaction schematic of a method for selectively depositing a seed layer and subsequently passivation film according to one or more embodiments.

FIG. 2 illustrates the first monomer, 1,2,4,5-tetrazine, forming the passivation film. In the method 200, a first substrate surface 210 is provided. The substrate surface 210 is deposited with a seed layer 211. The method at 221 provides exposing the seed layer to a first monomer, 1,2,4,5-tetrazine, which results in forming a passivation film 213. During with method at 214, the passivation layer 213 is exposed to a second monomer, 1,4-diethynylbenzene, increasing the thickness of passivation film 213. The passivation film 213 is again exposed to the first monomer, 1,2,4,5-tetrazine, further increasing the thickness of passivation film 213. The method at 214 includes cyclic deposition of the first monomer and the second monomer such that the passivation film 213 has a desired thickness.

In some embodiments, after forming the passivation film, the atomic layer deposition is performed to deposit the ALD film or grow the thickness of ALD film. In some embodiments, the thickness of ALD film is equal to or less than the thickness of passivation film. In some embodiments, wherein the passivation film is formed on the metal surface, the ALD film comprises the dielectric material. Non-limiting examples of the dielectric material includes $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ or combination thereof. In some embodiments, wherein the seed layer is deposited on the dielectric surface, the ALD film comprises metal, metal alloy, metal oxide, metal nitride, or combination thereof. Non-limiting examples of the metal may be copper, cobalt, nickel, tungsten, ruthenium, chromium, iron, platinum, gold, silver, molybdenum, gallium, indium or combination thereof. In some embodiments, after depositing the ALD film, the passivation film is removed. In some embodiments, the passivation film is removed by exposing the substrate to $O_2$ or $O_2$ plasma.

In some embodiments, the passivation film, wherein the passivation film has a thickness, is further exposed to a second monomer to grow the thickness of passivation film. In some embodiments, the second monomer comprises an alkyne derivative. In some embodiments, the alkyne derivative includes a dialkyne or a trialkyne derivative. In some embodiments, the alkyne derivative may be selected from the group consisting of 1,4-diethynylbenzene, 1,3,5-triethynylbenzene or combination thereof. FIG. 2 shows the passivation film 1,4-diethynylbenzene reacting to the second monomer.

Figure 3:
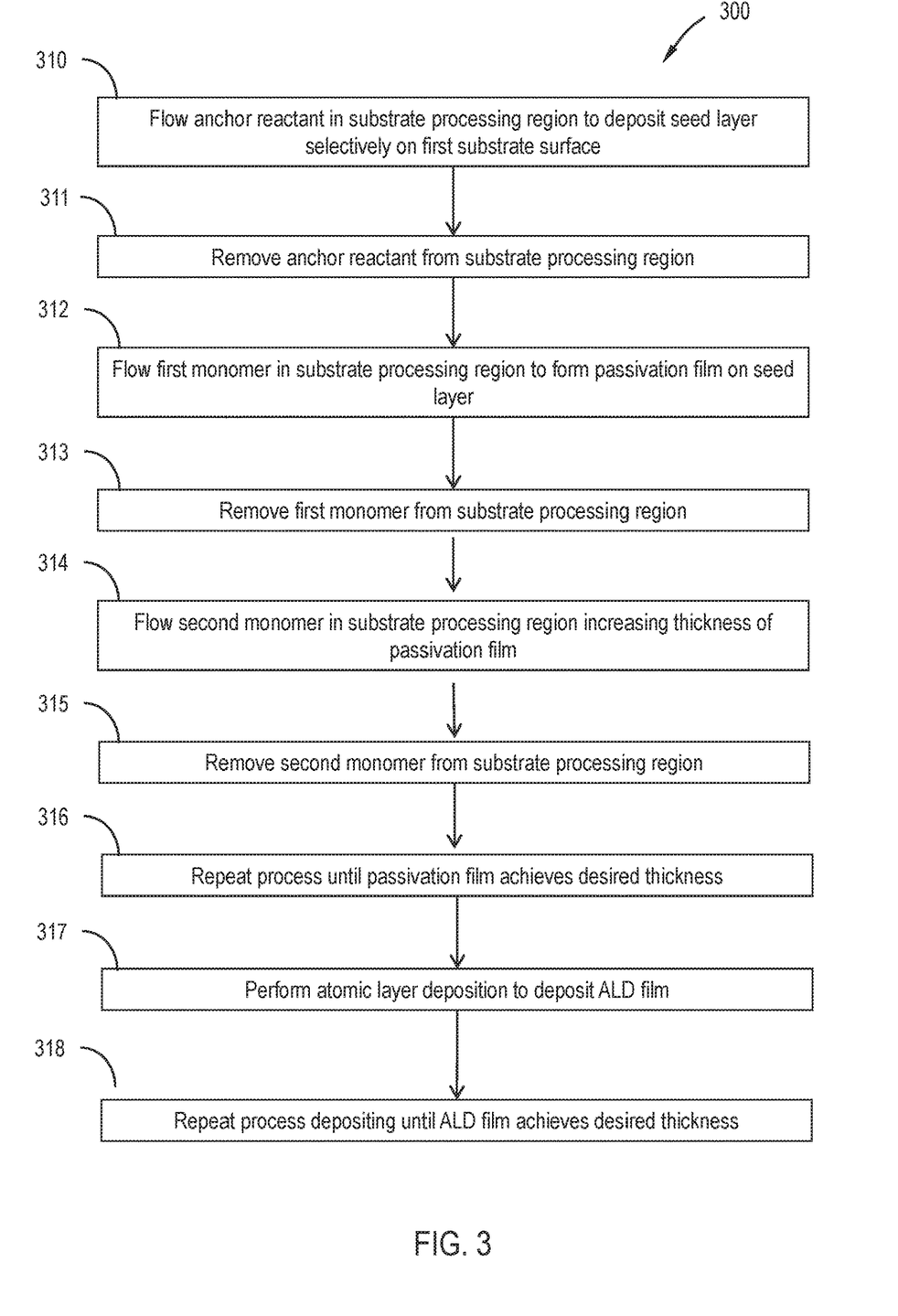
FIG. 3 is a flowchart of a method according to one or more embodiments.

FIG. 3 is a flowchart illustrating a detailed exemplary embodiment of a method 300. At 310, anchor reactant is flowed in a substrate processing region to selectively deposit a seed layer on a first substrate surface. At 311, the anchor reactant is removed from the substrate processing region, at 312 a first a first monomer is flowed in the substrate processing region to form a passivation film on the seed layer, and at 313, the first monomer is removed from the substrate processing region. At 314 a second monomer is flowed in the substrate processing region, increasing the thickness of the passivation film, and at 315 the second monomer is removed from the substrate processing region. At 316, the process is repeated until a desired film thickness is achieved, and at 317, ALD is performed to deposit an ALD film. At 318, the process of is repeated until a desired ALD film thickness is achieved.

In some embodiments, after exposing with the second monomer, the atomic layer deposition is performed to deposit the ALD film or grow the thickness of ALD film. In some embodiments, the thickness of ALD film is equal to or less than the thickness of passivation film. In some embodiments, wherein the passivation film is formed on the metal surface, the ALD film comprises the dielectric material. Non-limiting examples of the dielectric material includes $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ or combination thereof. In some embodiments, wherein the seed layer is deposited on the dielectric surface, the ALD film comprises metal, metal alloy, metal oxide, metal nitride, or combination thereof. Non-limiting examples of the metal may be copper, cobalt, nickel, tungsten, ruthenium, chromium, iron, platinum, gold, silver, molybdenum, gallium, indium or combination thereof. In some embodiments, after depositing the ALD film, the passivation film is removed. In some embodiments, the passivation film is removed by exposing the substrate to $O_2$ or $O_2$ plasma.

Another aspect of the disclosure provides a cyclic deposition of the passivation film and the ALD film, wherein the passivation film is cyclically grown alongside the ALD film such that the thickness of ALD film remains equal to or less than the thickness of passivation film. The method reduces a sideways growth issue, also referred to a mushroom issue. FIG. 2 shows the growth of the passivation film by the cyclic deposition. The atomic layer deposition may be performed intermittently such that the thickness of resulting ALD film remains equal to or less than the thickness of passivation film. In some embodiments, the step of reacting to the first monomer, exposing to the second monomer and performing the atomic layer deposition is sequentially repeated at least once. In some embodiments, the sequential repetition is performed in the range of from: 1 to 1000, 1 to 950, 1 to 900, 1 to 850, 1 to 800, 1 to 750, 1 to 700, 1 to 650, 1 to 600, 1 to 550, 1 to 500, 1 to 450, 1 to 400, 1 to 350, 1 to 300, 1 to 250, 1 to 200, 1 to 150, 1 to 100, 1 to 75, 1 to 50, 1 to 25, 200 to 1000, 300 to 1000, 400 to 1000, 500 to 1000, 600 to 1000, 700 to 1000, 800 to 1000, 900 to 1000 times. In some embodiments, the sequential repetition is performed until the final thickness of ALD film is in the desired range. In some embodiments, the desired range includes 1 Å to 1000 Å, 1 Å to 950 Å, 1 Å to 900 Å, 1 Å to 850 Å, 1 Å to 800 Å, 1 Å to 750 Å, 1 Å to 700 Å, 1 Å to 650 Å, 1 Å to 600 Å, 1 Å to 550 Å, 1 Å to 500 Å, 1 Å to 450 Å, 1 Å to 400 Å, 1 Å to 350 Å, 1 Å to 300 Å, 1 Å to 250 Å, 1 Å to 200 Å, 1 Å to 150 Å, 1 Å to 100 Å, 1 Å to 80 Å, 1 Å to 60 Å, 1 Å to 50 Å, 1 Å to 40 Å, 1 Å to 30 Å, 1 Å to 20 Å, 1 Å to 10 Å, 100 Å to 1000 Å, 200 Å to 1000 Å, 300 Å to 1000 Å, 400 Å to 1000 Å, 500 Å to 1000 Å, 600 Å to 1000 Å, 700 Å to 1000 Å, 800 Å to 1000 Å and 900 Å to 1000 Å.

In some embodiments, the step of reacting to the first monomer and exposing to the second monomer increases the thickness of passivation film in the range of from 1 nm to 50 nm, 1 nm to 45 nm, 1 nm to 40 nm, 1 nm to 35 nm, 1 nm to 30 nm, 1 nm to 25 nm, 5 nm to 50 nm, 5 nm to 45 nm, 5 nm to 40 nm, 5 nm to 35 nm, 5 nm to 30 nm, 5 nm to 25 nm, 10 nm to 50 nm, 10 nm to 45 nm, 10 nm to 40 nm, 10 nm to 35 nm, 10 nm to 30 nm, 10 nm to 25 nm, 15 nm to 50 nm, 15 nm to 45 nm, 15 nm to 40 nm, 15 nm to 35 nm, 15 nm to 30 nm, 15 nm to 25 nm, 20 nm to 50 nm, 20 nm to 45 nm, 20 nm to 40 nm, 20 nm to 35 nm, 20 nm to 30 nm, 20 nm to 25 nm, 25 nm to 50 nm, 25 nm to 45 nm, 25 nm to 40 nm, 25 nm to 35 nm or 25 nm to 30 nm with each repetition.

In some embodiments, the passivation film remains bound to the first surface at a higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C., or 50° C. to 500° C.

In some embodiments, wherein the thickness of ALD film is in the desired range, the passivation film is removed. In some embodiments, the passivation film is removed by exposing the substrate to $O_2$ or $O_2$ plasma.

In some embodiments, the passivation film is removed from the substrate after performing the atomic layer deposition. The passivation film may be removed by any suitable selective etching process. Suitable selective etching processes include, but are not limited to, the use of oxygen, oxygen plasmas and fluorine plasmas. In some embodiments, when oxygen or oxygen plasma is used to remove the seed layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the passivation film is removed by sequential exposure of the substrate to an oxygen plasma and a hydrogen plasma.

Figure 1:
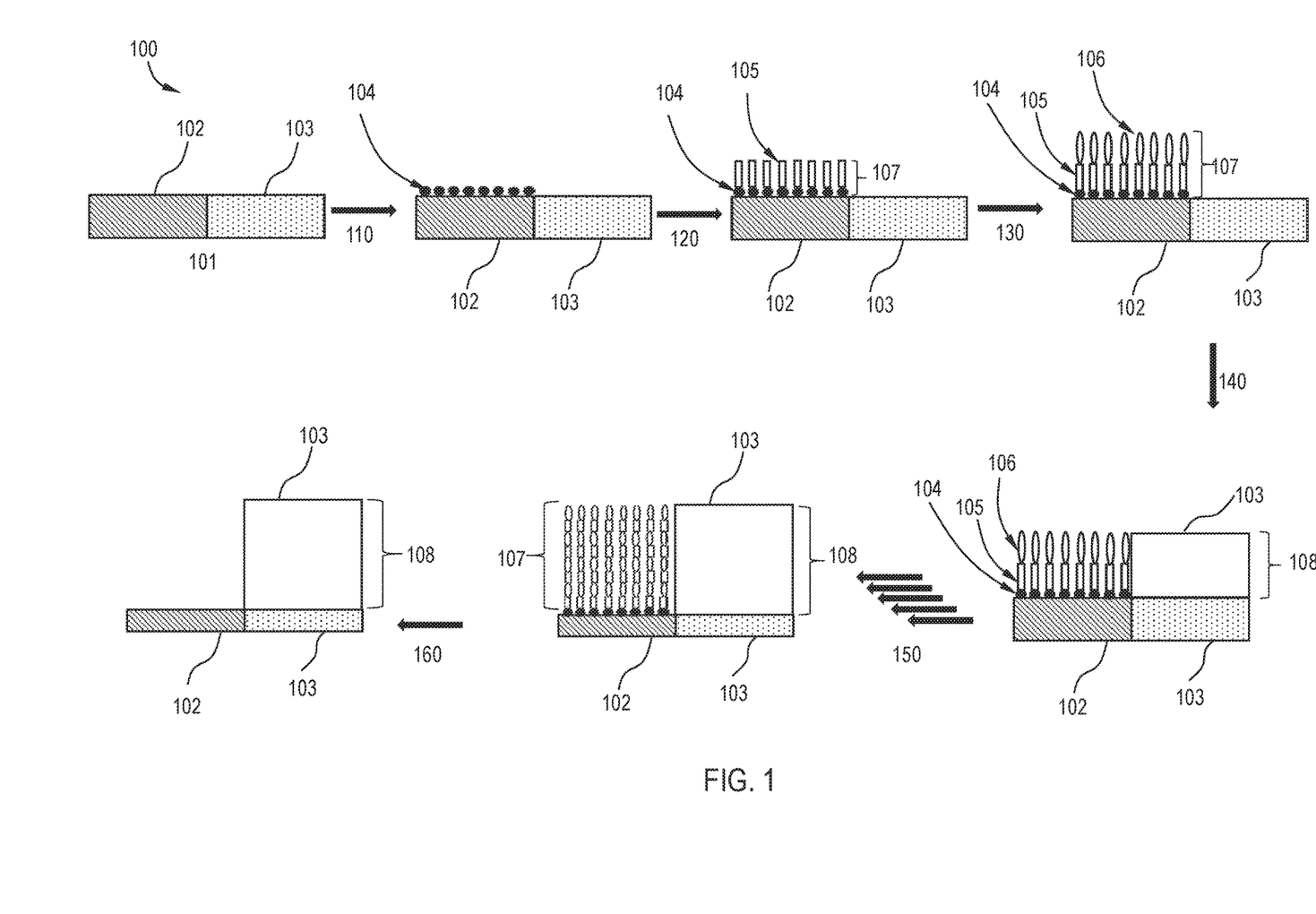
FIG. 1 shows a reaction schematic of selectively depositing an ALD film on a substrate according to one or more embodiments.

FIG. 1 illustrates a reaction schematic of selectively depositing an ALD film on a substrate according to one or more embodiments of a method 100. The substrate 101 comprises a first surface 102 and a second surface 103. In the method step 110, the first surface 102 is reacted with the anchor reactants depositing a seed layer 104 on the first surface 102. During the method step 120, the seed layer 104 is exposed to first monomers 105 forming a passivation film having a thickness 107. The seed layer bound first monomers 105 are then exposes to second monomers 106 increasing the thickness of passivation film 107 in the method step 130. Subsequently, in the method step 140, an atomic layer deposition is performed to deposit an ALD film 103 on the second surface such that the thickness of the ALD film 108 is not greater than the thickness of passivation film 107. The substrate then undergoes cyclic deposition method steps 150 with the first monomer 105, the second monomer 106 and ALD deposition 103 sequentially. Finally, the passivation film is removed. The removal can be achieved either by exposing the substrate to $O_2$ or $O_2$ plasma.

In some embodiments, the reaction zone is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process in some embodiments, exposure to each reactive gas, which includes but not limited to the metal and dielectric material to be used for the ALD film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between multiple times. The purge may also be conducted by applying a vacuum, without flowing gas.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the passivation film is deposited, the method may optionally include further processing (e.g., bulk deposition of a dielectric film). In some embodiments, the further processing may be an ALD process.

In one or more embodiments, the processes described herein may generally be stored in the memory as a software routine that, when executed by a controller or a processor, causes a substrate processing chamber to perform one or more processes of the present disclosure. The software routine may also be stored and/or executed by a second controller or processor (not shown) that is remotely located from the hardware being controlled by the controller or processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general purpose computer into a specific purpose computer (controller) that controls the chamber operation such that the processes are performed. The process can be stored on non-transitory computer readable medium including instructions, that, when executed by a controller or a processor of a substrate processing chamber, causes the substrate processing chamber to expose a substrate to an anchor reactant, a first monomer, a second monomer to form a passivation layer having a thickness and an ALD reactant in a predetermined order such that a resulting ALD film has a thickness that remains less than, greater than or equal to the thickness of the passivation layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a passivation film on a substrate, the method comprising:
    exposing the substrate comprising a first surface and a second surface to an anchor reactant; and
    selectively depositing the anchor reactant on the first surface as a seed layer, wherein the anchor reactant comprises an ethynyl derivative with a headgroup that selectively targets the first surface.

2. The method of claim 1, wherein the ethynyl derivative comprises 4-ethynylbenzene derivative.

3. The method of claim 1, wherein the first surface or the second surface comprises a metal selected from the group consisting of Cu, Co, Ni, W, Ru, Cr, Fe, Pt, Au, Ag, Mo, Ga and In.

4. The method of claim 3, wherein the headgroup of the anchor reactant is selected from the group consisting of —COOH, —COOR, —CONNR$_2$, —PO(OH)$_2$, —PO(OR)$_2$, —NH$_2$, —NR$_2$, acetylacetone, pyrrole, pyridine and thiophene, and wherein R is an alkyl or a phenyl derivative.

5. The method of claim 1, wherein the first surface or the second surface comprises a dielectric material selected from the group consisting of SiO$_x$, Si$_x$N$_y$, Si, SiON, AlO$_x$, Al$_2$O$_3$, HfO$_x$, ZrO$_2$, TiO$_x$, TiN, Ta$_x$O$_5$, Ta$_2$O$_5$, Y$_2$O$_3$, La$_2$O$_3$, AlN, MgO, CaF$_2$, LiF, SrO, SiC, BaO, HfSiO$_4$, LaAlO$_3$, Nb$_2$O$_5$, BaTiO$_3$, SrTiO$_3$, Bi$_4$Ti$_3$O$_{12}$, Pb(Zr, Ti)O$_3$, CaCu$_3$Ti$_4$O$_{12}$, LiNbO$_3$, BaTiO$_3$, LiNbO$_3$ and KNbO$_3$.

6. The method of claim 5, wherein the headgroup of the anchor reactant is selected from the group consisting of —SiCl$_3$, —Si(OR)$_3$ and —Si(NR$_2$)$_3$, and wherein R is an alkyl or a phenyl derivative.

7. The method of claim 1, wherein the method further comprises exposing the seed layer to a first monomer to the passivation film.

8. The method of claim 7, wherein the first monomer comprises tetrazine derivative.

9. The method of claim 8, wherein the tetrazine derivative is selected from the group consisting of 1,2,4,5-tetrazine; 3,6-dimethyl-1,2,4,5-tetrazine; 3,6-diethyl-1,2,4,5-tetrazine; 3,6-dipropyl-1,2,4,5-tetrazine; and 3,6-di isopropyl-1,2,4,5-tetrazine.

10. The method of claim 7, wherein the passivation film has a thickness and the method further comprises exposing the passivation film to a second monomer to increase the thickness of the passivation film.

11. The method of claim 10, wherein the second monomer is an alkyne derivative.

12. The method of claim 11, wherein the alkyne derivative comprises a dialkyne or trialkyne derivative.

13. The method of claim 10, wherein the alkyne derivative is selected from the group consisting of 1,4-diethynylbenzene and 1,3,5-triethynylbenzene.

14. The method of claim 10, wherein the method further comprises performing an atomic layer deposition (ALD) process to deposit an ALD film having a thickness on the second surface, wherein the thickness of the ALD film is less than or equal to the thickness of passivation film.

15. The method of claim 14, wherein the second surface is a metal surface and the ALD film is selected from the group consisting of Cu, Co, Ni, W, Ru, Cr, Fe, Pt, Au, Ag, Mo, Ga and In.

16. The method of claim 14, wherein the second surface is a dielectric surface and the ALD film is selected from the group consisting of SiO$_x$, Si$_x$N$_y$, Si, SiON, AlO$_x$, Al$_2$O$_3$, HfO$_x$, ZrO$_2$, TiO$_x$, TiN, Ta$_x$O$_5$, Ta$_2$O$_5$, Y$_2$O$_3$, La$_2$O$_3$, AN, MgO, CaF$_2$, LiF, SrO, SiC, BaO, HfSiO$_4$, LaAlO$_3$, Nb$_2$O$_5$, BaTiO$_3$, SrTiO$_3$, Bi$_4$Ti$_3$O$_{12}$, Pb(Zr, Ti)O$_3$, CaCu$_3$Ti$_4$O$_{12}$, LiNbO$_3$, BaTiO$_3$, LiNbO$_3$ and KNbO$_3$.

17. A non-transitory computer readable medium including instructions, that, when executed by a controller of a substrate processing chamber, causes the substrate processing chamber toperform the method of claim 1.

18. A method of depositing an ALD film, the method comprising:
(a) exposing a substrate comprising a first surface and a second surface to an anchoring reactant, wherein the anchoring reactant is a 4-ethylnylbenzene derivative with a headgroup that selectively targets the first surface and forms a seed layer;
(b) forming a passivation film, wherein the seed layer is exposed to a first monomer to form the passivation film having a thickness;
(c) growing the thickness of passivation film, wherein the passivation film is reacted to a second monomer;
(d) performing an atomic layer deposition to deposit the ALD film having a thickness, wherein the thickness of the ALD film remains equal to or less than the thickness of passivation film;
(e) repeating (b), (c) and (d) sequentially at least once, wherein the passivation film increases to a thickness in a range of from 1 nm to 50 nm with each repetition of (b) and (c); and
(f) removing the passivation film by exposing to O$_2$ or O$_2$ plasma.

19. The method of claim 18, wherein the method further comprises repeating (c), (d) and (e) sequentially at least once, wherein (c) and (d) increases the thickness of the passivation film in a range of from 1 nm to 50 nm with each repetition.

20. The method of claim 19 further comprises removing the passivation film, wherein the removal is performed by exposing the first surface to O$_2$ or O$_2$ plasma.

* * * * *